United States Patent
Sheu et al.

(10) Patent No.: US 6,522,066 B2
(45) Date of Patent: Feb. 18, 2003

(54) PIXEL STRUCTURE OF AN ORGANIC LIGHT-EMITTING DIODE DISPLAY DEVICE AND ITS FABRICATION METHOD

(75) Inventors: Chai-Yuan Sheu, Hsinchu (TW); Wen-Chun Wang, Taichung (TW); Yung-Hui Yeh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 152 days.

(21) Appl. No.: 09/803,450

(22) Filed: Mar. 8, 2001

(65) Prior Publication Data

US 2002/0125820 A1 Sep. 12, 2002

(51) Int. Cl.$^7$ ................................ H01J 1/62; H01J 9/00
(52) U.S. Cl. ...................... 313/505; 313/498; 445/23; 445/24
(58) Field of Search ................................ 313/505, 506, 313/498, 509; 437/40; 438/29; 148/DIG. 150

(56) References Cited

U.S. PATENT DOCUMENTS

5,550,066 A    8/1996   Tang et al.

Primary Examiner—Nimeshkumar D. Patel
Assistant Examiner—Sharlene Leurig (57) ABSTRACT

A pixel structure of a full-color organic light-emitting diode (OLED) display device comprises a black matrix, a color changing medium, two thin film transistors, a storage capacitor, and an OLED device arranged on a substrate. The pixel structure of the display device uses blue organic light-emitting diodes or polymer light-emitting diodes as electroluminescent media. The low-temperature poly Si (LTPS) thin film transistors provide a current to the OLED device and serve as an active driving device. The color changing medium changes blue light into red or green light to form full-color OLED. The processing steps include the black matrix process, the island process, the gate process, the interlayer process, the color changing medium process, and the OLED deposition process. Because a color changing medium is integrated on the LTPS thin film transistors, this invention can make display devices of high resolution, high luminous efficiency and wide viewing angle.

15 Claims, 13 Drawing Sheets

PIXEL STRUCTURE OF AN ORGANIC LIGHT-EMITTING DIODE DISPLAY DEVICE AND ITS FABRICATION METHOD

FIELD OF THE INVENTION

The present invention relates generally to a pixel structure of an organic light-emitting diode (OLED) display device and its fabrication method, and more particularly to a pixel structure of a full-color OLED display device and its fabrication method.

BACKGROUND OF THE INVENTION

Flat-panel displays have become one of the most important electronic devices in products such as notebook computers and pocket-TVs. Among the flat-panel displays, organic electroluminescent (OEL) displays have the following advantages: light emitting, high luminous efficiency, wide viewing angle, fast response speed, high reliability, full color, low driving voltage, low power consumption and simple fabrication. Undoubtedly, this product has emerged as the display of choice in the market place. The fabrication method of a conventional full-color OLED display device includes at least the following five methods: (a) using a precision photo-mask to get a pixel array of red, green, and blue (RGB) colors in a small molecule system, (b) using color filters to filter the white light from white-light OEL elements to get the three RGB colors, (c) using light changing layer to change the original blue or purple light from a blue or purple-light OEL element into light of other colors, (d) using dielectric stacking layers of different thickness to change original wide-band spectrum light to RGB colors by the reflection and interference principles of the light, and (e) stacking devices of RGB colors on the same picture element on a two-side transparent OEL element.

Figure 1:
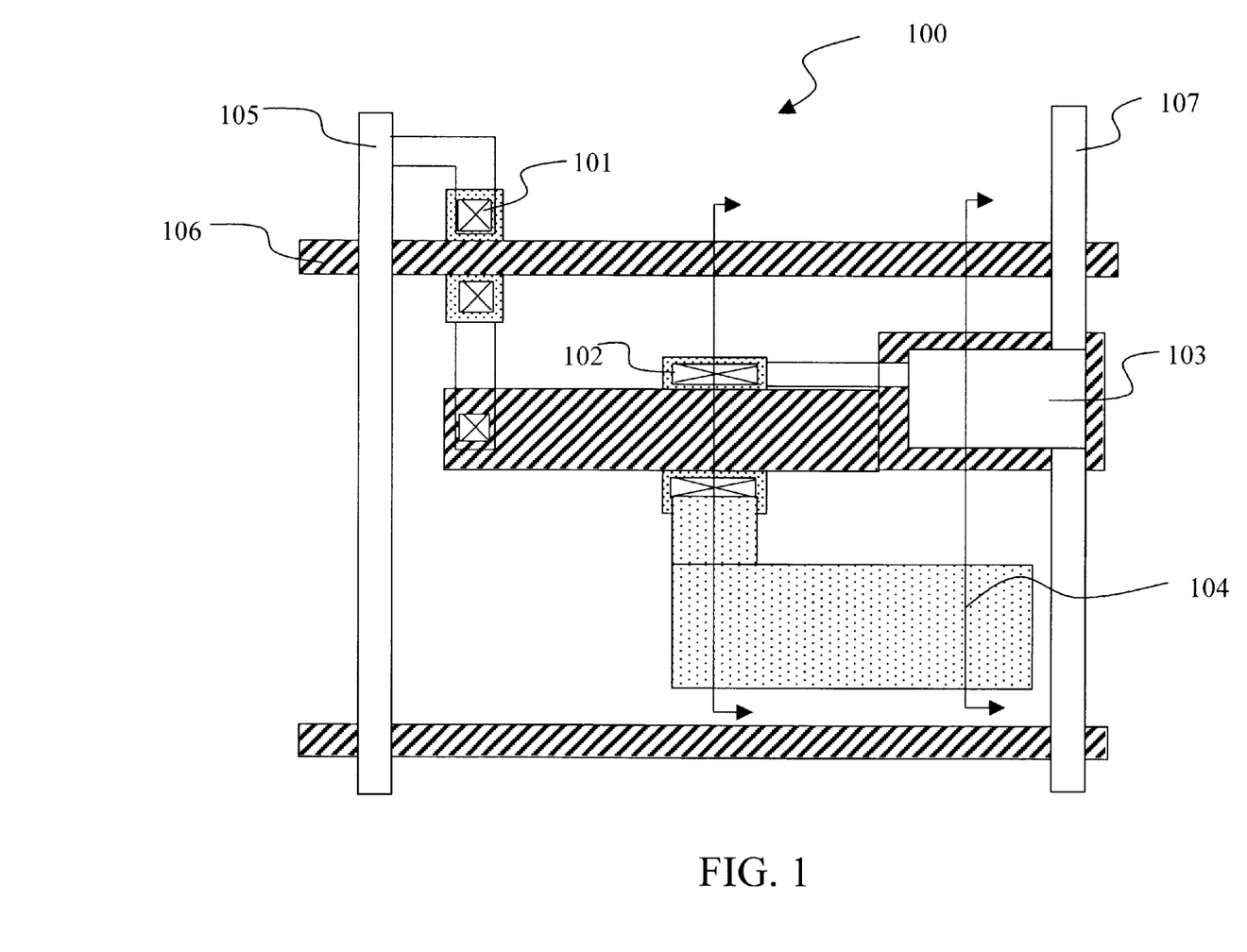
FIG. 1 is a diagrammatic plan view of a conventional TFT-OEL device.

US Pat. No. 5,550,066 discloses a process for making a pixel structure of a thin-film-transistor (TFT) organic electroluminescent device. FIG. 1 is a diagrammatic plan view of this conventional TFT-OEL device. As shown in FIG. 1, the TFT-OEL device 100 comprises mainly two thin film transistors 101 and 102, a storage capacitor 103, and a light emitting OEL pad 104 arranged on a substrate. The TFT 101 is the logic transistor with a source bus 105 as the data line and a gate bus 106 as the gate line. The ground bus 107 is located above the gate bus 106 and below the storage capacitor 103. The source electrode of the TFT 101 is electrically connected to the source bus 105 and the gate electrode comprises a portion of the gate bus 106. The OEL pad 104 is electrically connected to the drain of the TFT 102. The drain of the TFT 101 is electrically connected to the gate electrode of the TFT 102 that in turn is electrically connected to the storage capacitor 103. The TFT-OEL devices are typically pixels that are formed into a flat panel display.

Figure 2:
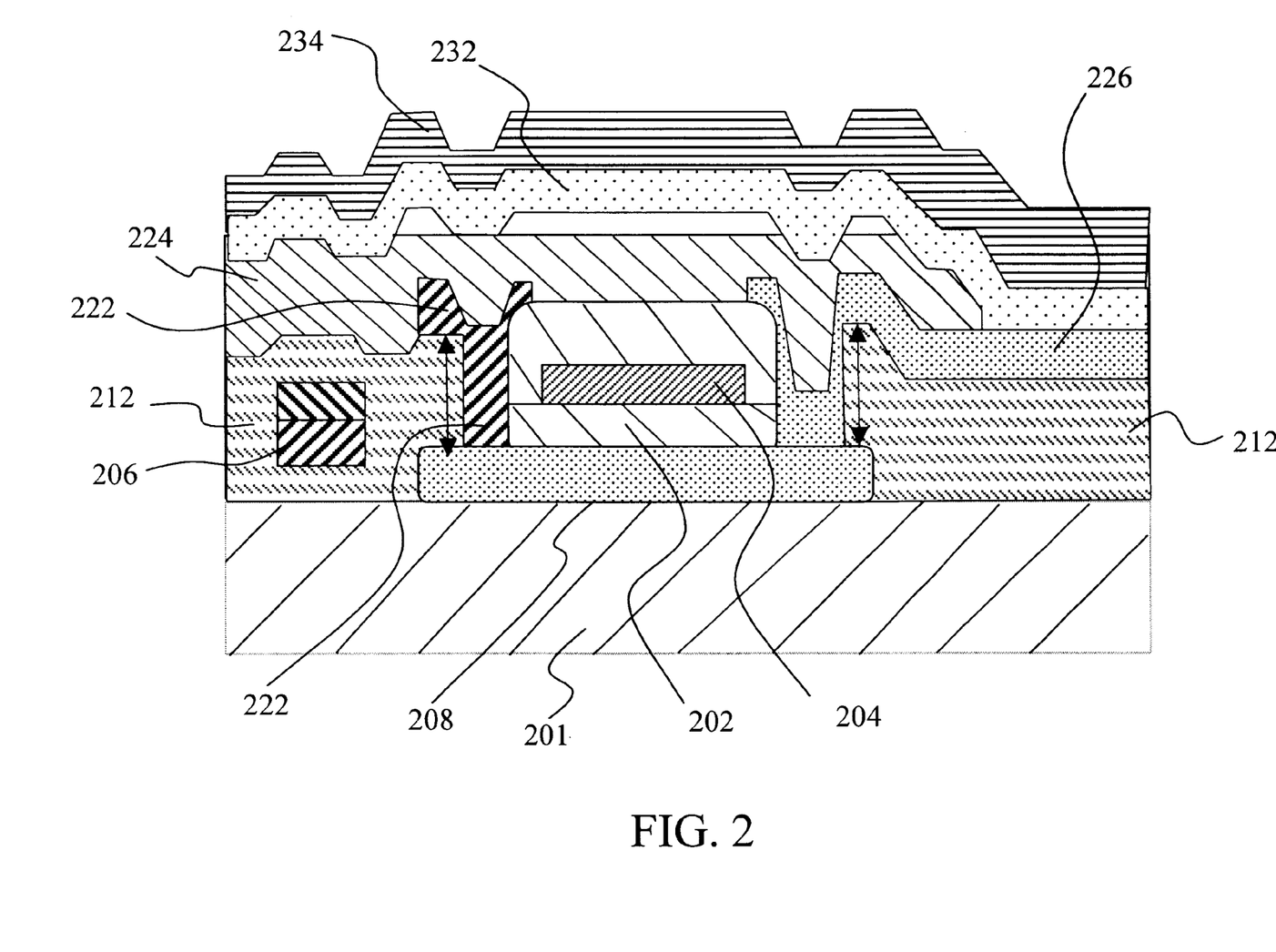
FIG. 2 is a cross-sectional view of FIG. 1.

FIG. 2 is a cross-sectional view of FIG. 1 illustrating the construction of a pixel structure of a conventional TFT-OEL device. As shown in FIG. 2, a polysilicon layer is deposited over a transparent insulating substrate 201 and the polysilicon layer is patterned into a polysilicon island 208. Next, an insulating gate layer 202 is deposited over the polysilicon island 208. A layer of silicon 204 is deposited over the insulating gate layer 202 and patterned by photolithography over the polysilicon island 208 so that after ion implantation, source and drain regions are formed in the polysilicon island 208. Ion implantation is conducted by doping with N-type dopants. A gate bus 206 is applied and patterned on the insulating gate layer 202, and a second insulating layer 212 is then applied over the entire surface of the device. Contact holes are cut in the second insulating layer 212 and electrode materials are applied to form contacts with the thin-film-transistors. The electrode material attached to the source region of TFT 102 also forms the top electrode 222 of the storage capacitor 103. A source bus and a ground bus are also formed over the second insulating layer 212. In contact with the drain region of TFT 102 is the anode for the OEL material. Then, a passivation layer 224, made of insulating material, is deposited over the surface of the device. The passivation layer 224 is etched leaving a tapered edge. The OEL layer 232 is then deposited over the passivation layer 224 and the anode layer. Finally, a cathode electrode layer 234 is deposited over the surface of the device.

There are some difficulties to overcome in order for the full-color organic electroluminescent display devices to be accepted the market of flat-panel displays. For instance, it is not easy to produce display devices of high resolution, high luminous efficiency and wide viewing angle. The brightness and luminous efficiency are not good enough for the OEL device that uses organic material of small molecules. For the OEL device that uses organic material of high molecules, although having RGB colors, the overall brightness and luminous efficiency are even worse than those of small molecules OEL device. Also, the materials used in OEL devices are not compatible with photolithography. Therefore, it is necessary to develop a simple and efficient fabrication method and structure for the full-color organic light-emitting display device.

SUMMARY OF THE INVENTION

The present invention has been made to overcome the above-mentioned difficulties of manufacturing a conventional organic light-emitting display device. The primary object of the invention is to provide a pixel structure of a full-color OLED display device. The pixel structure comprises mainly a black matrix, a color changing medium (CCM), two thin film transistors, a storage capacitor, and an OLED device structure arranged on a substrate.

Another object of the invention is to provide a fabrication method of the pixel structure of the full-color OLED display device. The processing steps for the pixel structure include the black matrix process, the island process, the gate process, the interlayer process, the color changing medium process, and the OLED deposition process.

According to the invention, the pixel structure of the full-color OLED display device uses blue organic light-emitting diodes or polymer light-emitting diodes as the electroluminescent media. The low-temperature poly Si (LTPS) thin film transistors provide a current to the OLED device and serve as an active driving device. The color changing medium changes blue light into red light or green light to form a full-color OLED. Because a color changing medium is integrated on the LTPS thin film transistors, this invention can make display devices of high resolution, high luminous efficiency and wide viewing angle.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 3:
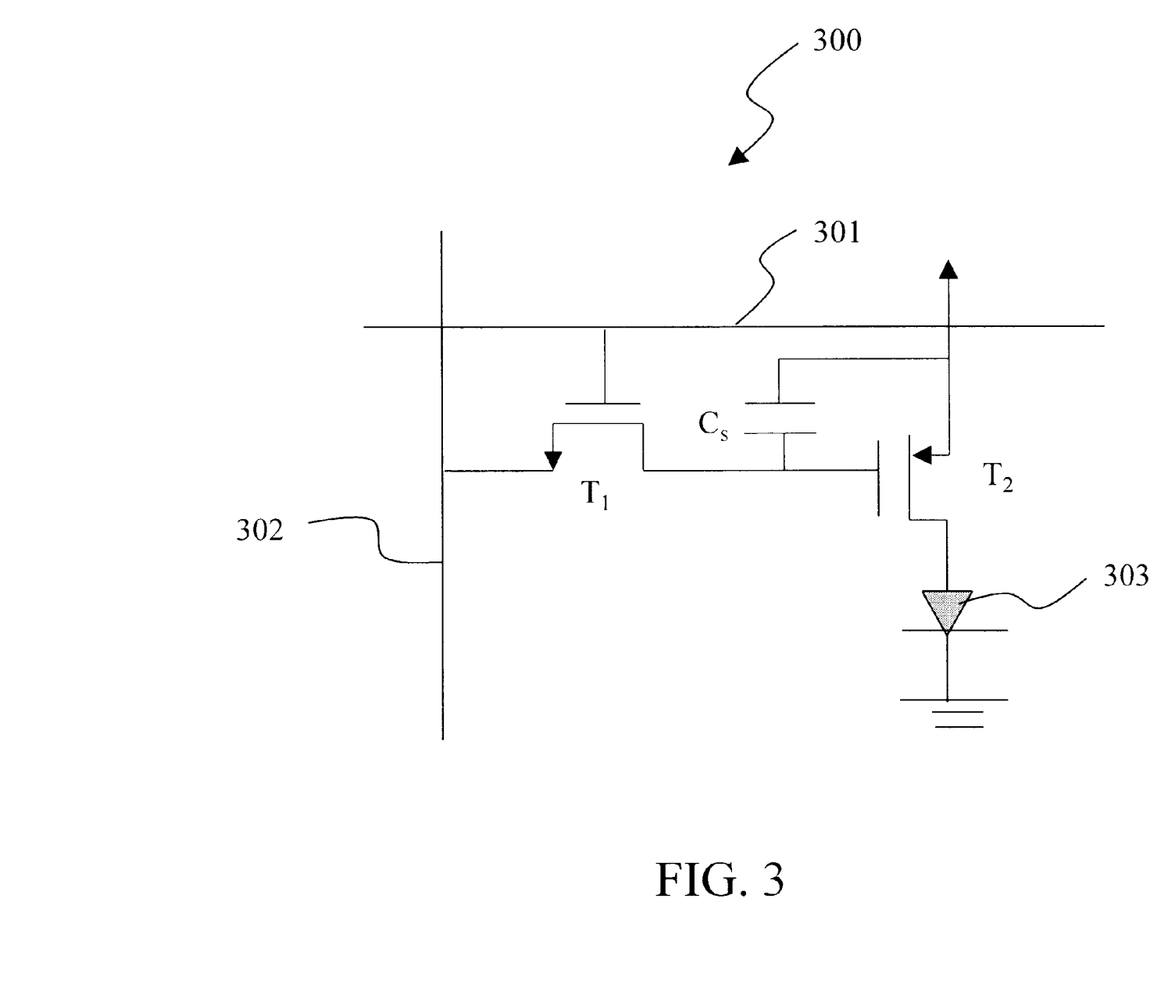
FIG. 3 is a schematic diagram of a full-color OLED display device according to the invention.

FIG. 3 is a schematic diagram of a full-color OLED display device according to the invention. Each pixel structure 300 of the full-color OLED display device comprises mainly two thin film transistors $T_1$ and $T_2$, a storage capacitor $C_s$, and an OLED device structure. Both thin film transistors $T_1$ and $T_2$ comprise respectively a source electrode, a drain electrode and a gate electrode. The gate electrode of the TFT $T_1$ comprises a portion of a gate line 301. The source electrode of the TFT $T_1$ is electrically connected to a data line 302 and the drain electrode is electrically connected to the gate electrode of the TFT $T_2$. The gate electrode of the TFT $T_2$ is electrically connected to the storage capacitor $C_s$. The OLED device structure is electrically connected to the drain electrode of the TFT $T_2$.

Figure 4:
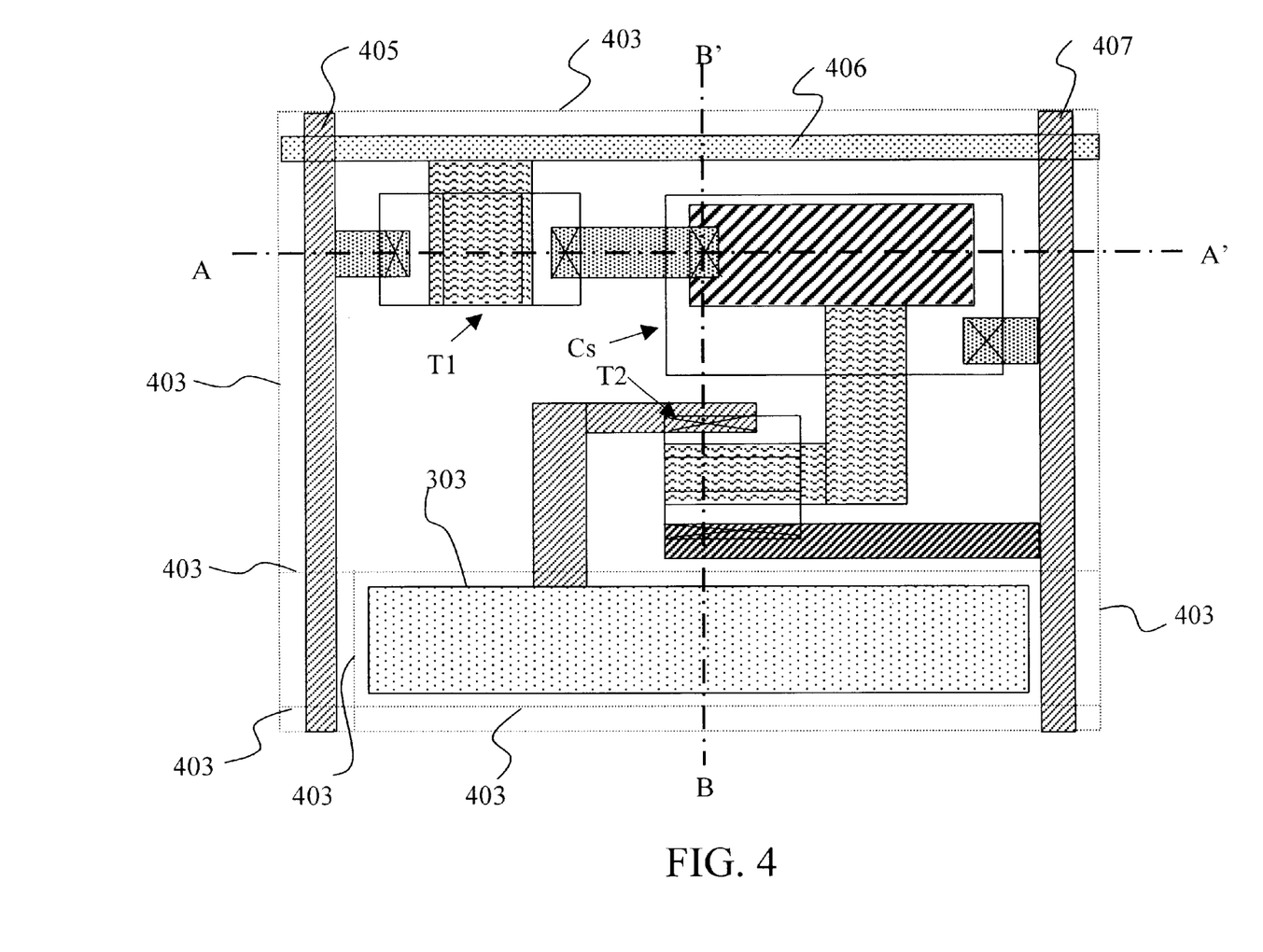
FIG. 4 is a diagrammatic plan view of a full-color OLED display device according to the invention.

FIG. 4 is a diagrammatic plan view of a full-color OLED display device according to the invention. Referring to FIG. 4, the TFT $T_2$ is in series with the OLED device and the TFT $T_1$ is in series with the storage capacitor $C_s$. The OLED device is connected on an insulating substrate (not shown). A black matrix region 403 that has several rectangular regions all have dotted lines is deposited over the insulating substrate. The TFT $T_1$ is the switch transistor with the data bus line 405 as the data line, the gate bus line 406 as the gate line and $V_{dd}$ bus 407 as the power supply bus.

In the preferred embodiments, a low-temperature poly Si thin film transistor is used to provide a current to the OLED device and is served as an active driving device. The OLED device uses blue organic light-emitting diodes or polymer light-emitting diodes as the electroluminescent media.

FIGS. 5–10 show cross-sectional views taken along section line B—B' in FIG. 4 illustrating the processing steps for a pixel structure of a full-color OLED display device according to the invention. The cross-sectional view shown in FIG. 11 is taken along line A—A' in FIG. 4.

As mentioned before, the processing steps for a pixel structure of a full-color OLED display device of the invention includes the black matrix process, the island process, the gate process, the interlayer process, the color changing medium process, and the OLED deposition process.

According to the invention, a color changing medium is integrated on the LTPS thin film transistors and the color changing medium changes blue light into red or green light to form full-color OLED. Therefore, this invention can make display devices of high resolution, high luminous efficiency and wide viewing angle.

Figure 5:
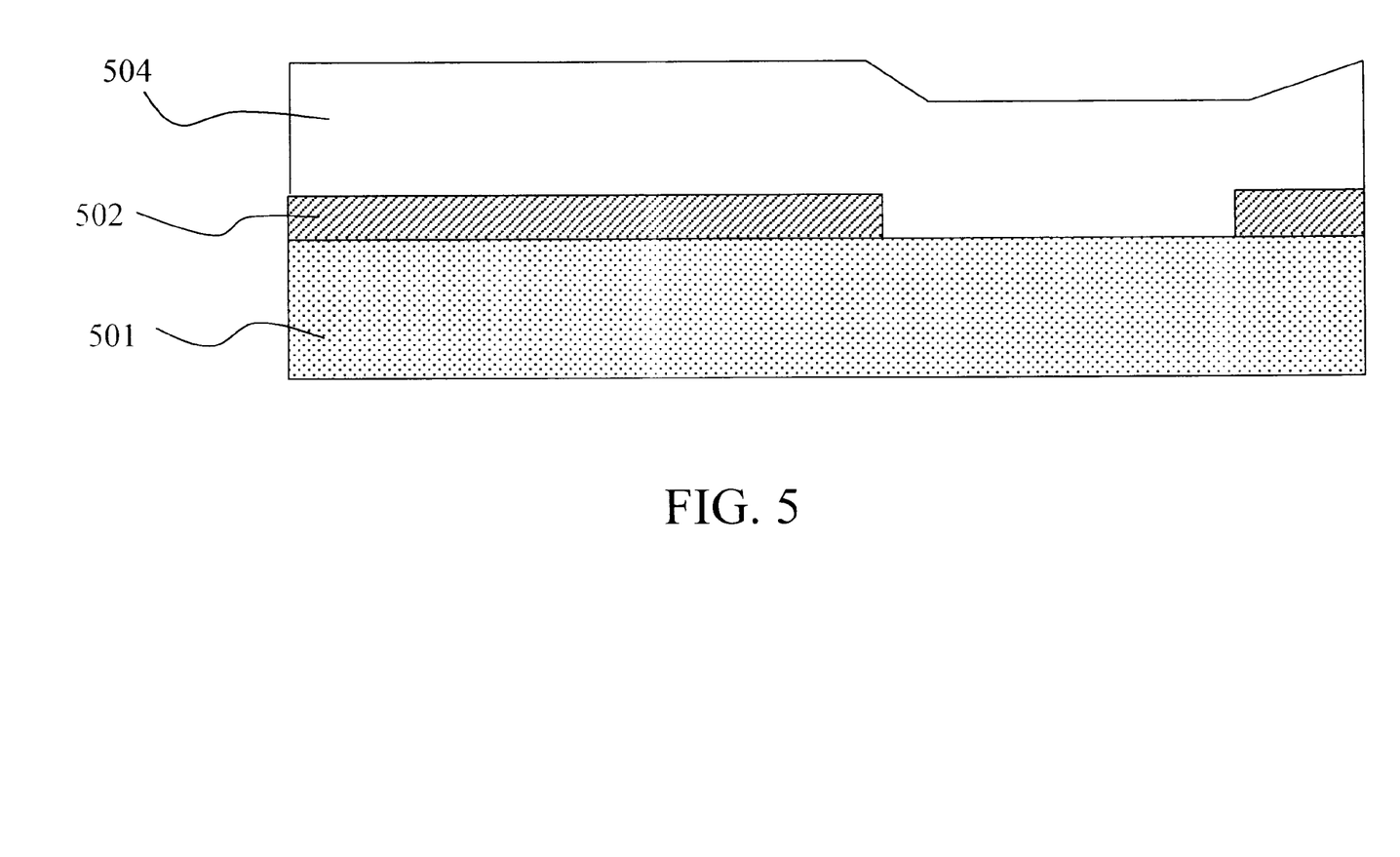
FIG. 5 is a cross-sectional view taken along line B—B' in FIG. 4 illustrating the black matrix process of a full-color OLED display device according to the invention.

FIG. 5 is a cross-sectional view taken along line B—B' illustrating the black matrix process. In this process, an insulating substrate 501 having top and bottom surfaces is provided. A black matrix region 502 is deposited and defined on the top surface of the insulating substrate 501. Then, a buffer layer 504 is deposited over the black matrix region 502.

Figure 6:
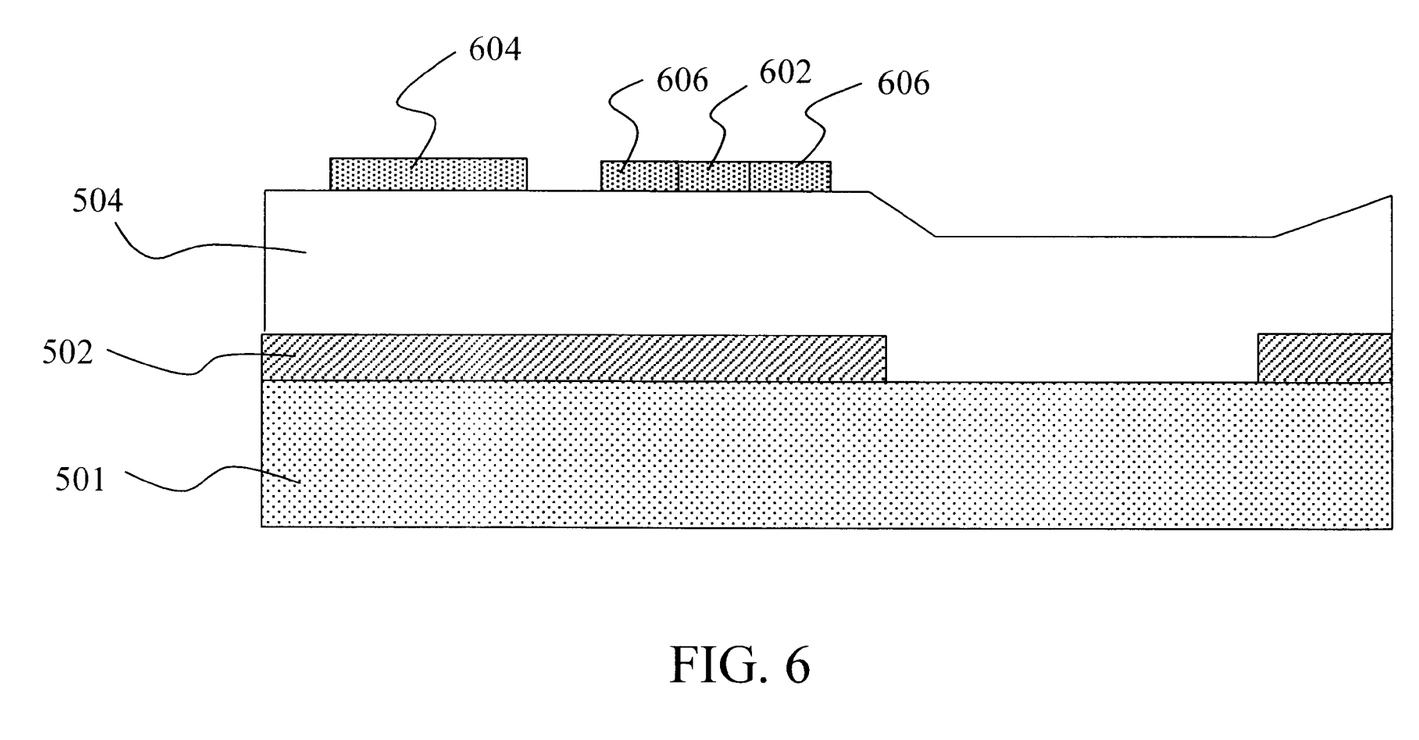
FIG. 6 is a cross-sectional view taken along line B—B' in FIG. 4 illustrating the island process of a full-color OLED display device according to the invention.

FIG. 6 is a cross-sectional view taken along line B—B' illustrating the island process. In this process, a poly-Si layer 602 is deposited over the buffer layer 504. A polycrystalline silicon island is then formed by a laser crystallization method and an etching method. The source and drain regions of the TFT $T_1$ and the source and drain regions of the TFT $T_2$ are patterned by photolithography so that after ion implantation, source and drain regions 606 are formed in the poly-si layer.

In the embodiment, the source and drain regions of the TFT $T_1$ are formed after ion implantation and are conducted by doping with $N^+$-type dopants 604 over the buffer layer 504. The source and drain regions of the TFT $T_2$ are conducted by doping with $P^+$-type dopants 606 over the buffer layer 504.

Figure 7:
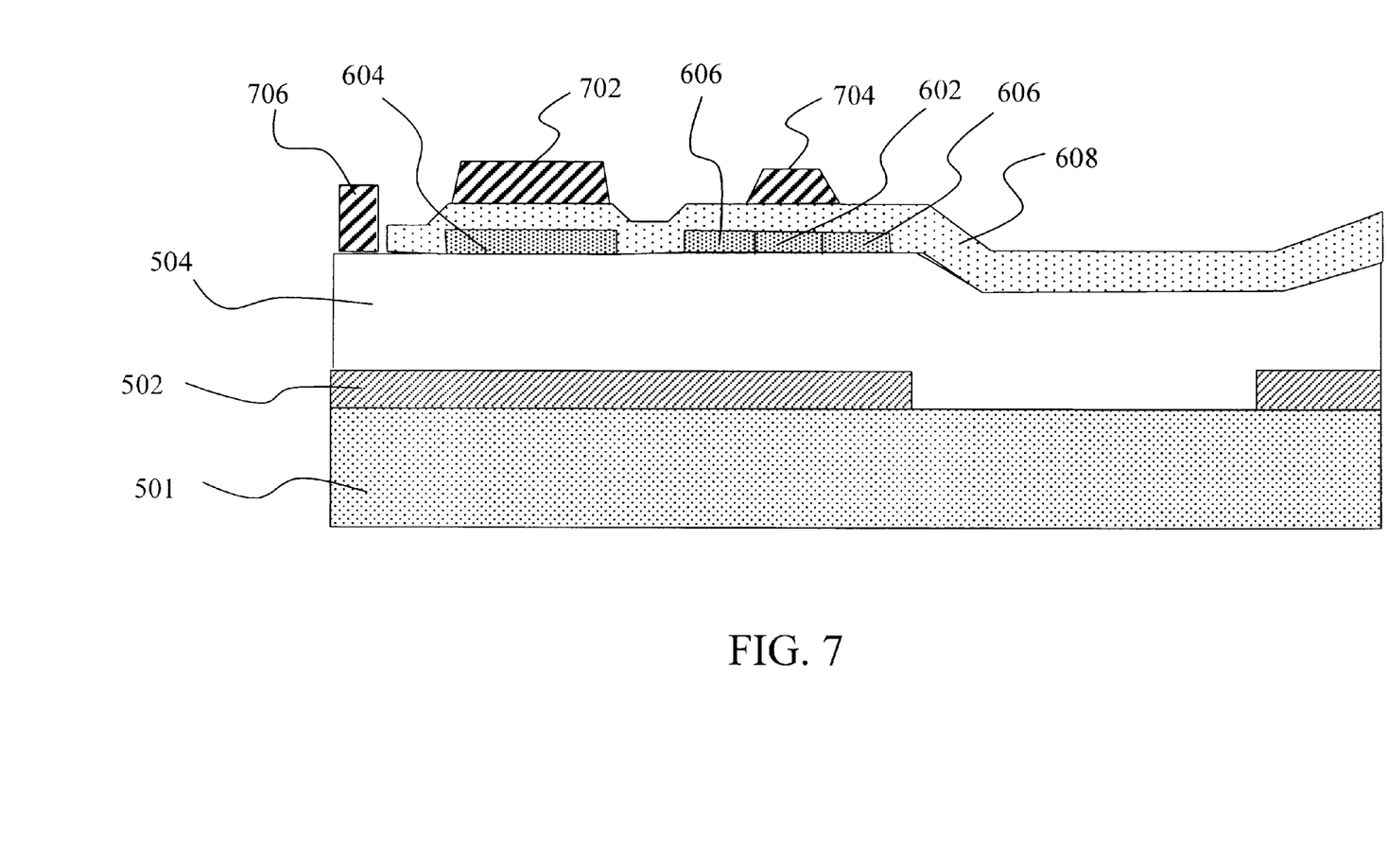
FIG. 7 is a cross-sectional view taken along line B—B' in FIG. 4 illustrating the gate process of a full-color OLED display device according to the invention.

FIG. 7 is a cross-sectional view taken along line B—B' illustrating the gate process. In this process, electrode materials are deposited over the polycrystalline silicon island to form a gate layer. In the preferred embodiment, gate oxides 608 and gate metal 706 are deposited respectively over the polycrystalline silicon island. Then the gate layer is defined, including defining gate electrodes 702 and 704 of thin film transistors $T_1$ and $T_2$.

Figure 8:
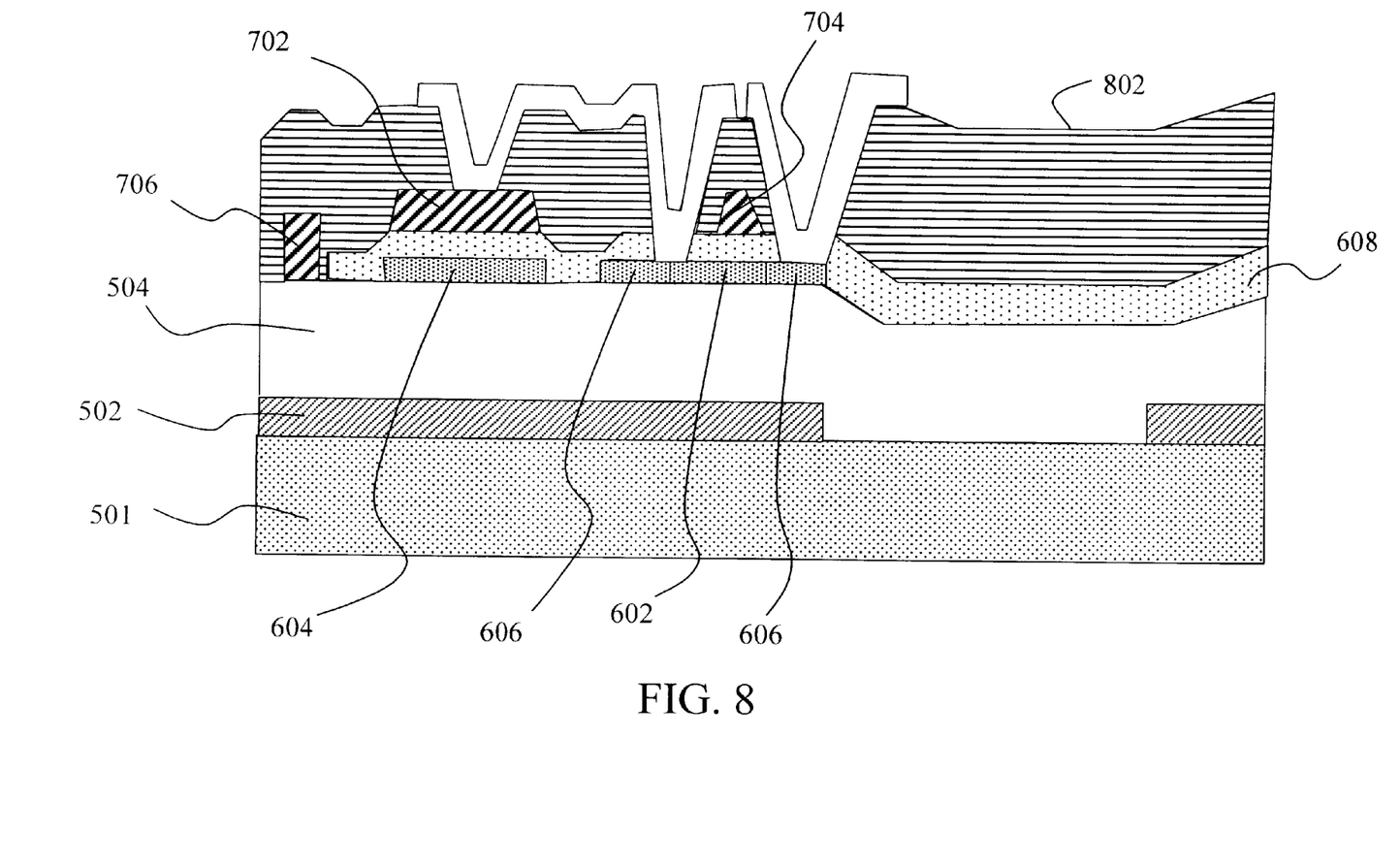
FIG. 8 is a cross-sectional view taken along line B—B' in FIG. 4 illustrating the interlayer process of a full-color OLED display device according to the invention.

FIG. 8 is a cross-sectional view taken along line B—B' illustrating the interlayer process. In this process, an interlayer 802 is deposited over the gate layer and the polycrystalline silicon island. The source and drain electrodes are deposited and patterned by a photolithography process and an etching method. Then, the source and drain electrode are formed.

Figure 9A:
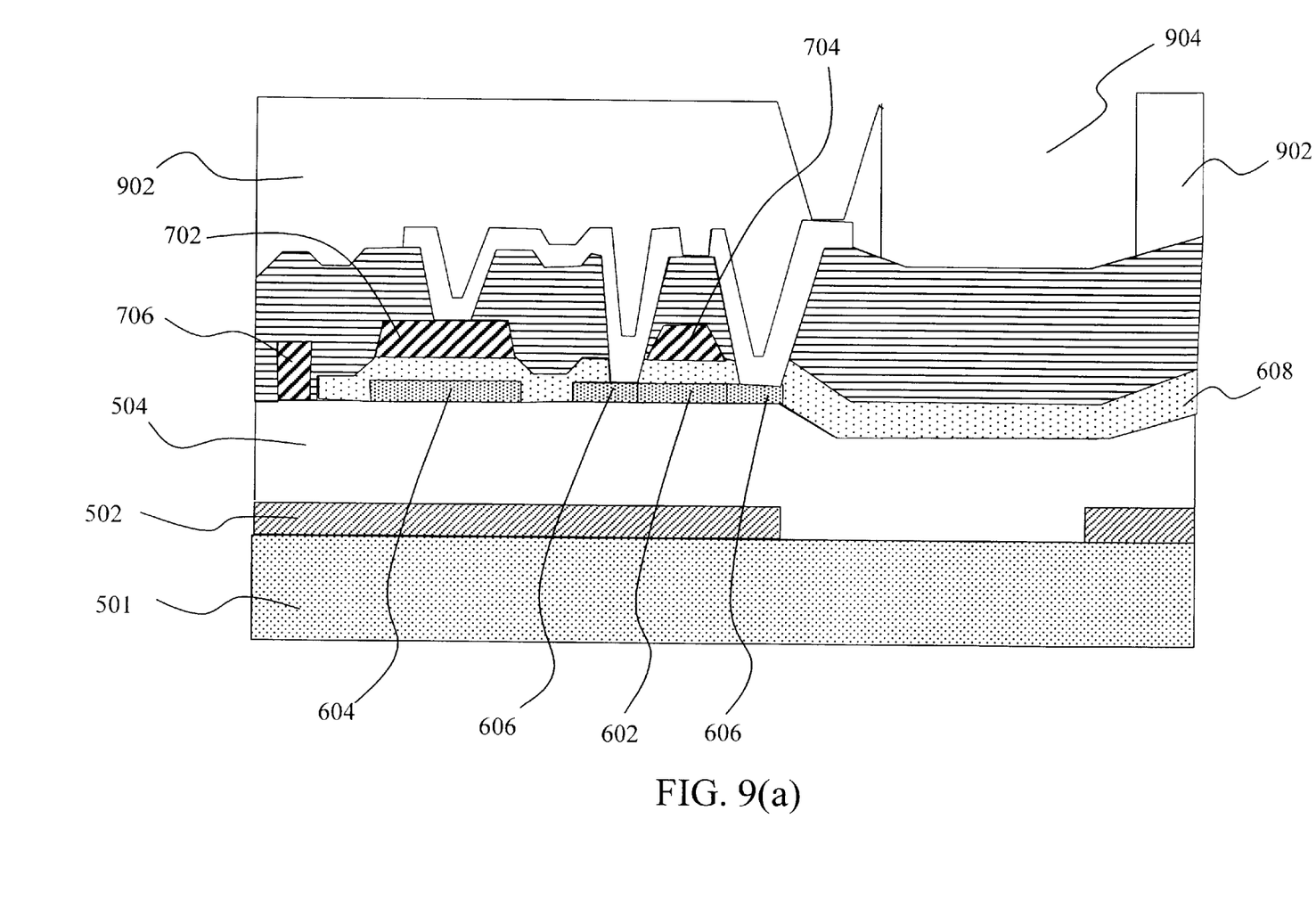
FIGS. 9a–9c are three cross-sectional views taken along line B—B' in FIG. 4 illustrating the color changing medium process of a full-color OLED display device according to the invention.
Figure 9B:
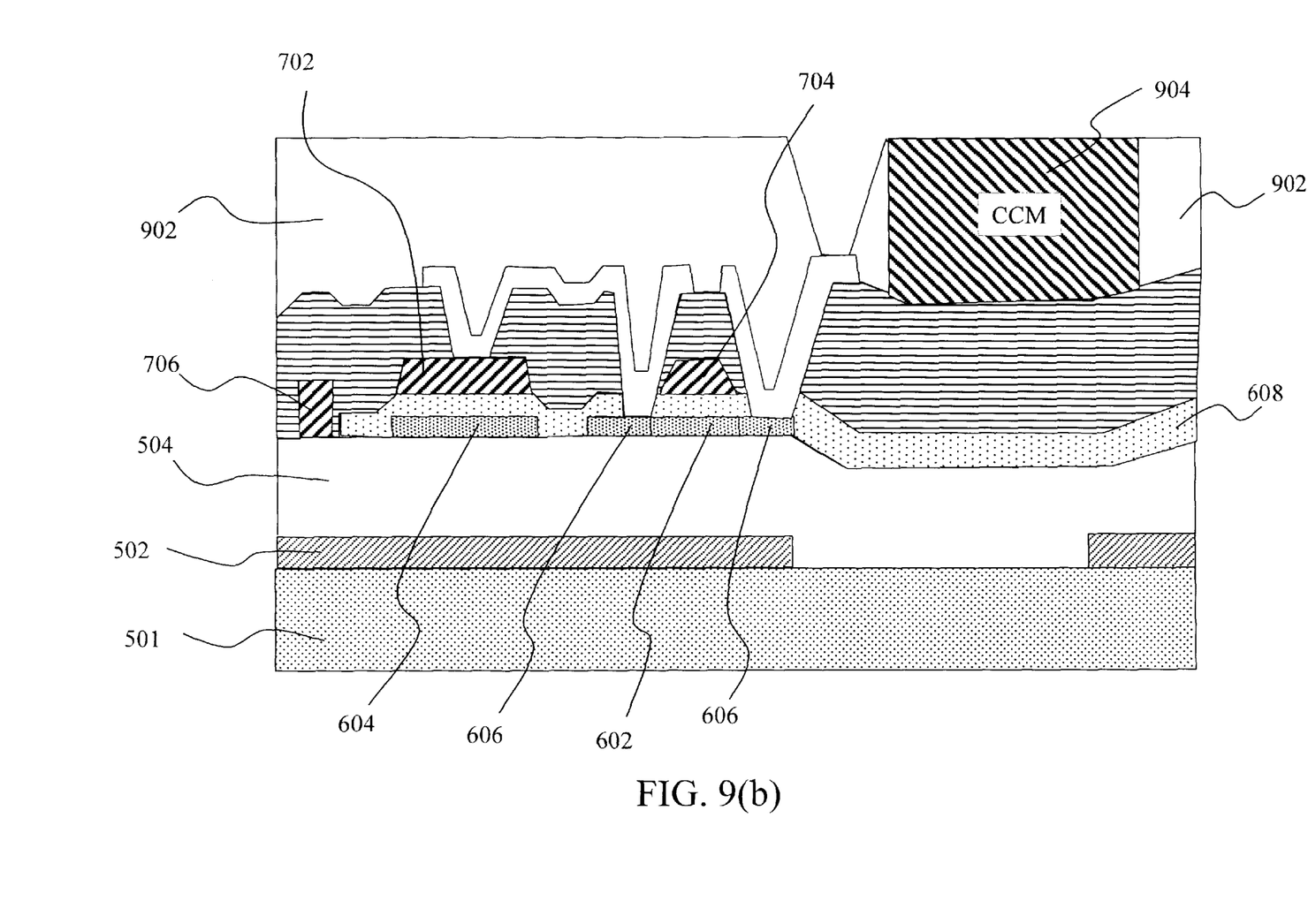
Figure 9C:
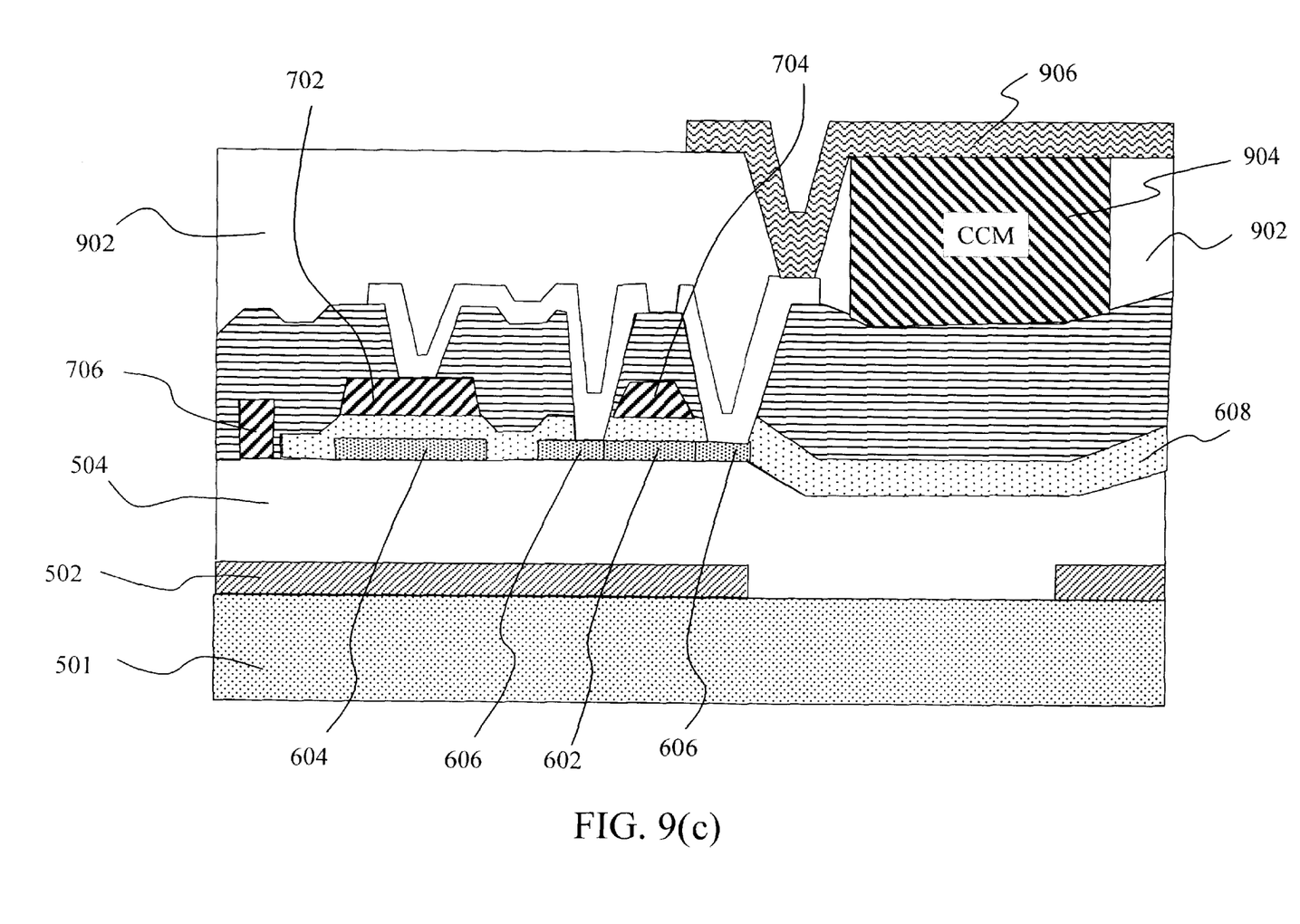

FIGS. 9a–9c are three cross-sectional views taken along line B—B' illustrating the color changing medium process. According to the invention, a color changing medium is integrated on the LTPS thin film transistors. In this process, a passivation layer 902 is deposited over the interlayer 802, followed by defining a color changing medium. The process of defining a color changing medium further comprises three steps. The first step etches the passivation layer to define a color changing medium region 904 and a portion of electrode contacting area. The result is shown in FIG. 9a. The second step is repeatedly spin coating the color changing medium region 904 and uses the photolithography technique to define color changing medium patterns of discrete red (R), green (G) and blue (B) pixels. After three times of spin coating and the exposure and development of the photolithography technique, the result is shown in FIG. 9b. The third step sputters a layer 906 of transparent conductive material, such as indium-tin-oxide (ITO), over the display device and defines the layer 906 of transparent conductive material. The result is shown in FIG. 9c.

Figure 10:
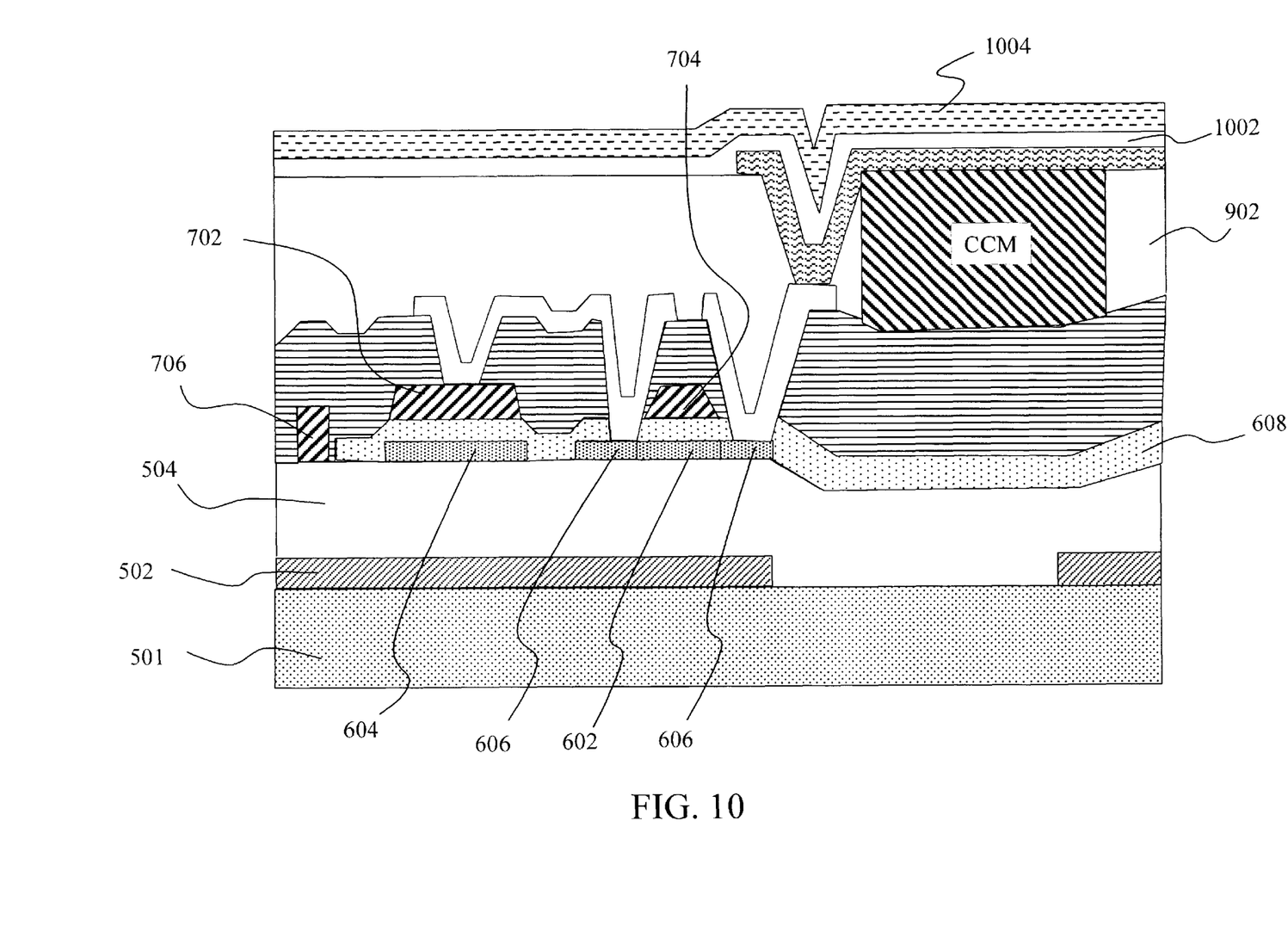
FIG. 10 is a cross-sectional view taken along line B—B' in FIG. 4 illustrating the OLED deposition process of a full-color OLED display device according to the invention.
Figure 11:
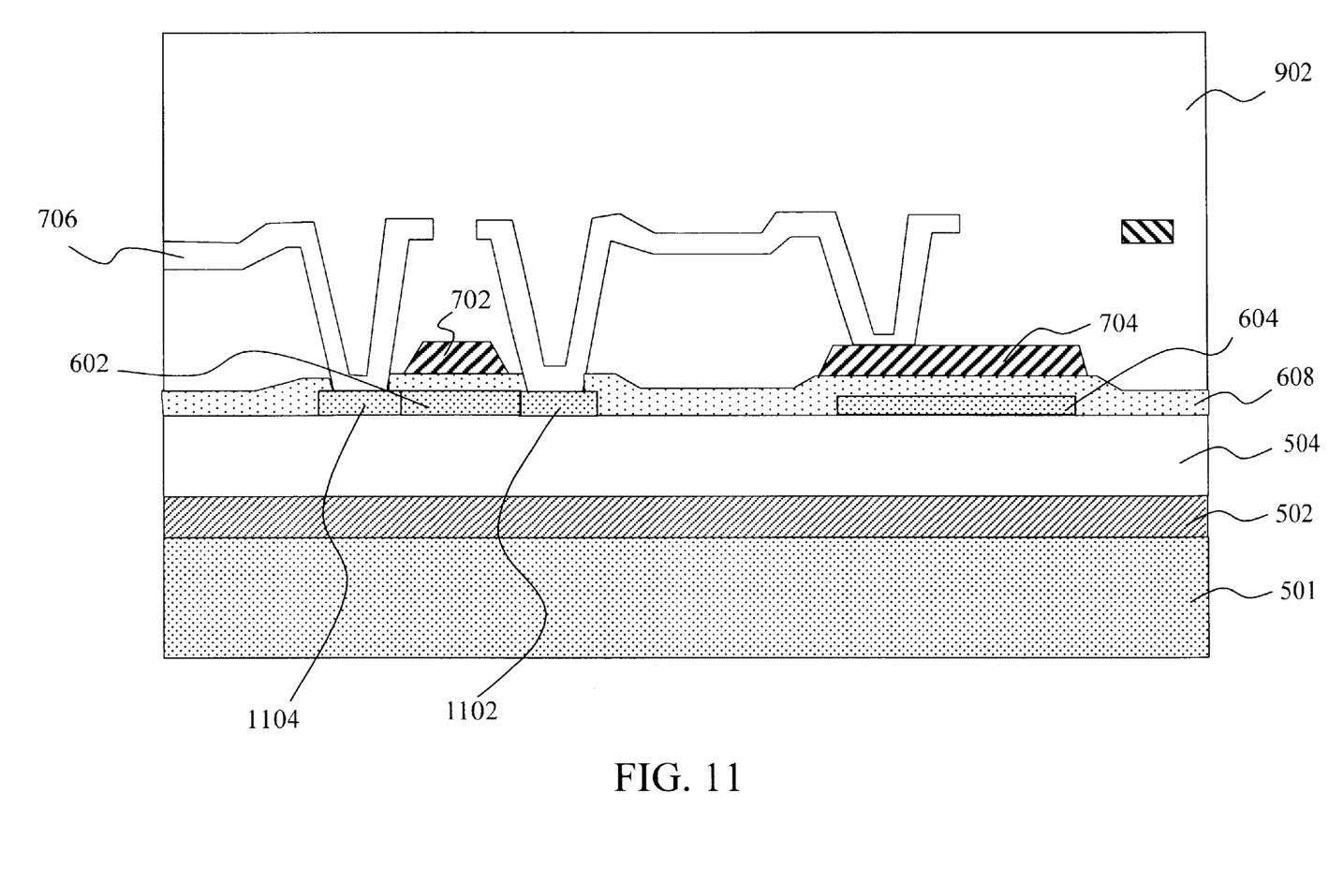
FIG. 11 is a cross-sectional view taken along line A—A' in FIG. 4.

FIG. 10 is a cross-sectional view taken along line B—B' illustrating the OLED deposition process. In this process, an OLED layer 1002 is deposited over the ITO layer 906 and the passivation layer 902. Finally, a cathode metal layer 1004 is deposited over the OLED layer 1002. FIG. 10 also shows a completed pixel structure of a full-color OLED display device according to the invention. In the preferred embodiment, blue organic light-emitting diodes or polymer light-emitting diodes are used as the electroluminescent media of the OLED layer.

Because blue organic light-emitting diodes or polymer light-emitting diodes are used as the light source, the blue light can be changed to the red or green light by the color changing medium to form the full-color OLED. Also, because a color changing medium is integrated on the LTPS thin film transistors, this invention can make display devices of high resolution, high luminous efficiency and wide viewing angle.

FIG. 11 is a cross-sectional view taken along line A—A' in FIG. 4 where the source and drain electrode regions 1102 and 1104 of the thin film transistor $T_1$ are conducted by doping with $N^+$-type dopants.

Although this invention has been described with a certain degree of particularity, it is to be understood that the present disclosure has been made by way of preferred embodiments only and that numerous changes in the detailed construction and combination as well as arrangement of parts may be restored to without departing from the spirit and scope of the invention as hereinafter set forth.

What is claimed is:

1. A pixel structure of a full-color organic light-emitting diode display device, said pixel structure comprising:
   a black matrix region deposited and defined on a top surface of an insulating substrate;
   a buffer layer deposited over said black matrix region;
   a polycrystalline silicon layer deposited over said buffer layer, said polycrystalline silicon layer having source and drain regions of a first thin-film-transistor and source and drain regions of a second thin-film-transistor defined therein for forming a polycrystalline silicon island;
   a gate layer deposited over said polycrystalline silicon island and defining gate electrodes of said first and second thin film transistors therein;
   a storage capacitor;
   an interlayer deposited over said gate layer and said polycrystalline silicon island and defining source and drain electrode metal regions therein;
   a passivation layer deposited over said interlayer;
   a color changing medium region defined in said passivation layer;
   a layer of transparent conductive material deposited over said color changing medium region and a portion of said passivation layer;
   an organic light-emitting diode layer deposited over said layer of transparent conductive material and said passivation layer; and
   a cathode metal layer deposited over said organic light-emitting diode layer.

2. The pixel structure of a full-color organic light-emitting diode display device as claimed in claim 1, said organic light-emitting diode layer being electrically connected to the drain electrode of said second thin-film-transistor.

3. The pixel structure of a full-color organic light-emitting diode display device as claimed in claim 1, the drain electrode of said first thin-film-transistor being electrically connected to the gate electrode of said second thin-film-transistor.

4. The pixel structure of a full-color organic light-emitting diode display device as claimed in claim 1, said second thin-film-transistor being a low-temperature poly Si thin-film-transistor for providing current to said organic light-emitting diode layer.

5. The pixel structure of a full-color organic light-emitting diode display device as claimed in claim 1, said second thin-film-transistor being an active driving device.

6. The pixel structure of a full-color organic light-emitting diode display device as claimed in claim 1, the gate electrode of said second thin-film-transistor being electrically connected to said storage capacitor.

7. The pixel structure of a full-color organic light-emitting diode display device as claimed in claim 1, said second thin-film-transistor being in series with said organic light-emitting diode layer and said first thin-film-transistor being in series with said storage capacitor.

8. A method of fabricating a pixel structure of a full-color organic light-emitting diode display device comprising the steps of:
   (a) preparing an insulating substrate;
   (b) depositing and defining a black matrix region on a top surface of said insulating substrate;
   (c) depositing a buffer layer over said black matrix region;
   (d) depositing a polycrystalline silicon layer over said buffer layer;
   (e) defining source and drain regions of a first thin-film-transistor and source and drain regions of a second thin-film-transistor to form a polycrystalline silicon island by a laser crystallization method and an etching method;
   (f) depositing electrode materials to form a gate layer over said polycrystalline silicon island;
   (g) depositing an interlayer over said gate layer and said polycrystalline silicon island and depositing and patterning source and drain electrodes by a photolithography process and an etching method;
   (h) depositing a passivation layer over said interlayer and forming a color changing medium region in said passivation layer;
   (i) depositing a layer of transparent conductive material over said color changing medium region and a portion of said passivation layer;
   (j) depositing an organic light-emitting diode layer over said layer of transparent conductive material and said passivation layer; and
   (k) depositing a cathode metal layer over said organic light-emitting diode layer.

9. The method of fabricating a pixel structure of a full-color organic light-emitting diode display device as claimed in claim 8, wherein defining source and drain regions of said first thin-film-transistor in step (e) includes doping with $N^+$-type dopants over said buffer layer, and defining source and drain regions of said second thin-film-transistor in step (e) includes doping with $P^+$-type dopants over said buffer layer.

10. The method of fabricating a pixel structure of a full-color organic light-emitting diode display device as claimed in claim 8, said electrode materials in step (f) including gate oxide and gate metal.

11. The method of fabricating a pixel structure of a full-color organic light-emitting diode display device as claimed in claim 8, said gate layer in step (f) including gate electrodes of said first and second thin film transistors.

12. The method of fabricating a pixel structure of a full-color organic light-emitting diode display device as claimed in claim 8, wherein forming a color changing medium region in step (h) further comprises the steps of:
(h1) etching said passivation layer to define said color changing medium region and a portion of electrode contacting area; and
(h2) filling said color changing medium region with color changing media by spin-coating repeatedly and forming color changing medium patterns of discrete red, green, and blue pixels using photolithography technique.

13. The method of fabricating a pixel structure of a full-color organic light-emitting diode display device as claimed in claim 8, said transparent conductive material in step (i) being indium-tin-oxide.

14. The method of fabricating a pixel structure of a full-color organic light-emitting diode display device as claimed in claim 8, said organic light-emitting diode layer in step (j) using blue organic light-emitting diodes as electroluminescent media.

15. The method of fabricating a pixel structure of a full-color organic light-emitting diode display device as claimed in claim 8, said organic light-emitting diode layer in step (j) using polymer light-emitting diodes as electroluminescent media.

* * * * *